(12) United States Patent
Hamilton et al.

(10) Patent No.: US 6,579,781 B1
(45) Date of Patent: Jun. 17, 2003

(54) ELIMINATION OF N+ CONTACT IMPLANT FROM FLASH TECHNOLOGIES BY REPLACEMENT WITH STANDARD DOUBLE-DIFFUSED AND N+ IMPLANTS

(75) Inventors: Darlene G. Hamilton, San Jose, CA (US); Len Toyoshiba, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/619,231

(22) Filed: Jul. 19, 2000

(51) Int. Cl.[7] .............................................. H01L 21/425
(52) U.S. Cl. ................. 438/514; 438/510; 438/520; 438/258; 438/260
(58) Field of Search ................. 438/514, 258, 438/257, 259, 260, 510, 520, 521

(56) References Cited

U.S. PATENT DOCUMENTS

| | | | | |
|---|---|---|---|---|
| 5,482,881 A | * | 1/1996 | Chen et al. ................. | 437/43 |
| 5,517,049 A | * | 5/1996 | Huang ........................ | 257/357 |
| 5,534,455 A | * | 7/1996 | Liu ............................. | 437/43 |
| 5,759,901 A | * | 6/1998 | Lah et al. ................... | 438/305 |
| 5,849,614 A | * | 12/1998 | Chan .......................... | 438/230 |
| 5,998,266 A | * | 12/1999 | So .............................. | 438/270 |
| 6,190,987 B1 | * | 2/2001 | Kasai et al. ................ | 438/381 |

FOREIGN PATENT DOCUMENTS

| | | | | |
|---|---|---|---|---|
| JP | 410275870 A | * | 10/1998 | ....... H01L/21/8247 |
| JP | 2001168303 A | * | 3/1999 | ....... H01L/21/8239 |

* cited by examiner

Primary Examiner—Matthew Smith
Assistant Examiner—Renzo N. Rocchegiani

(57) ABSTRACT

A method of manufacturing a semiconductor device that eliminates the n+ contact implant by using double diffused implants under the core cell contacts by forming core, n-channel and p-channel transistors in a semiconductor substrate, simultaneously forming source and drain DDI implants for the core transistors, forming source and drain Mdd implants for the core transistors, forming source and drain Pldd implants for the p-channel transistors, forming source and drain Nldd implants for the n-channel transistors, forming sidewall spacers on the core, n-channel and p-channel transistors, forming N+ implants for the n-channel transistors, forming P+ implants for the p-channel transistors and forming P+ contact implants for the p-channel transistors.

14 Claims, 17 Drawing Sheets

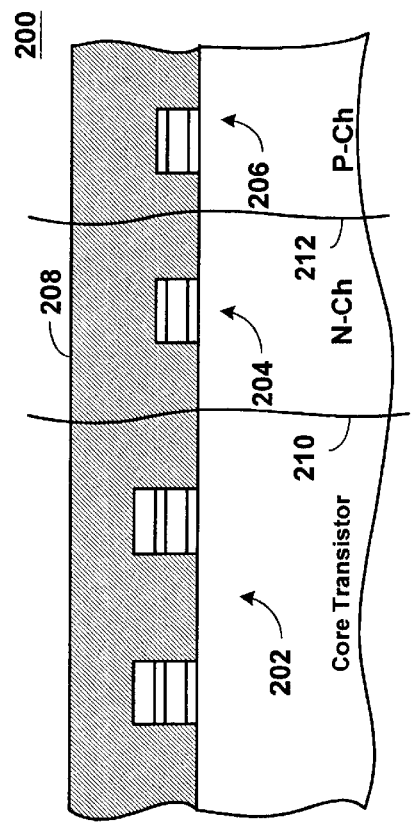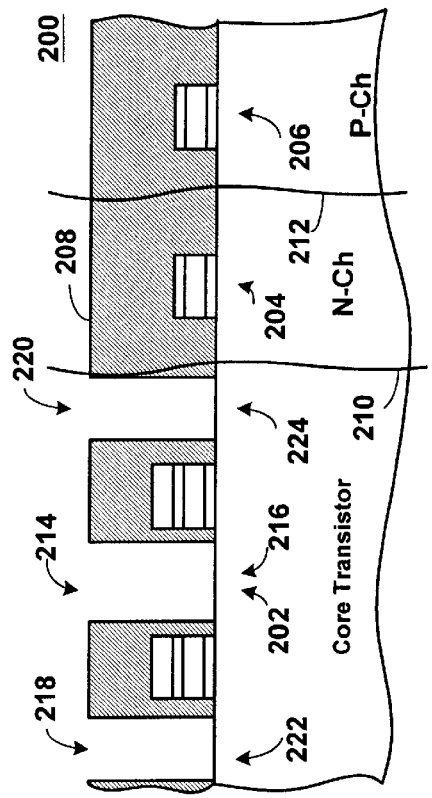
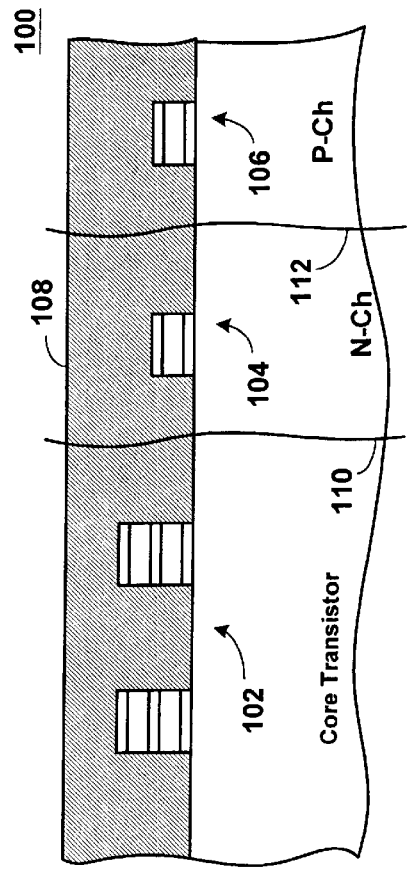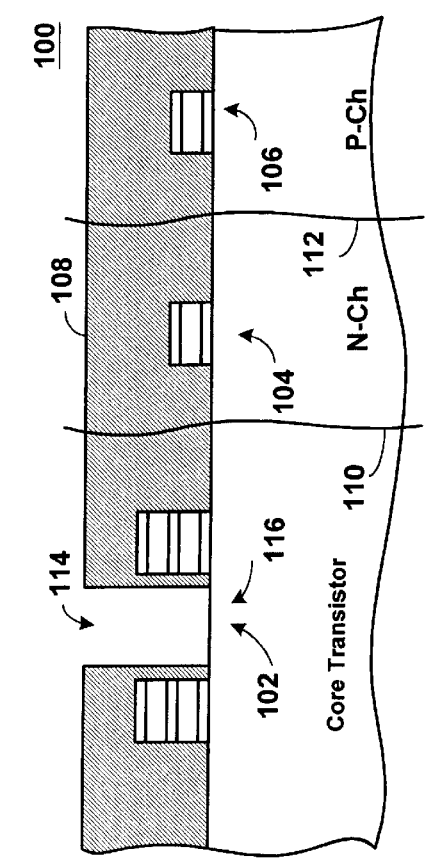

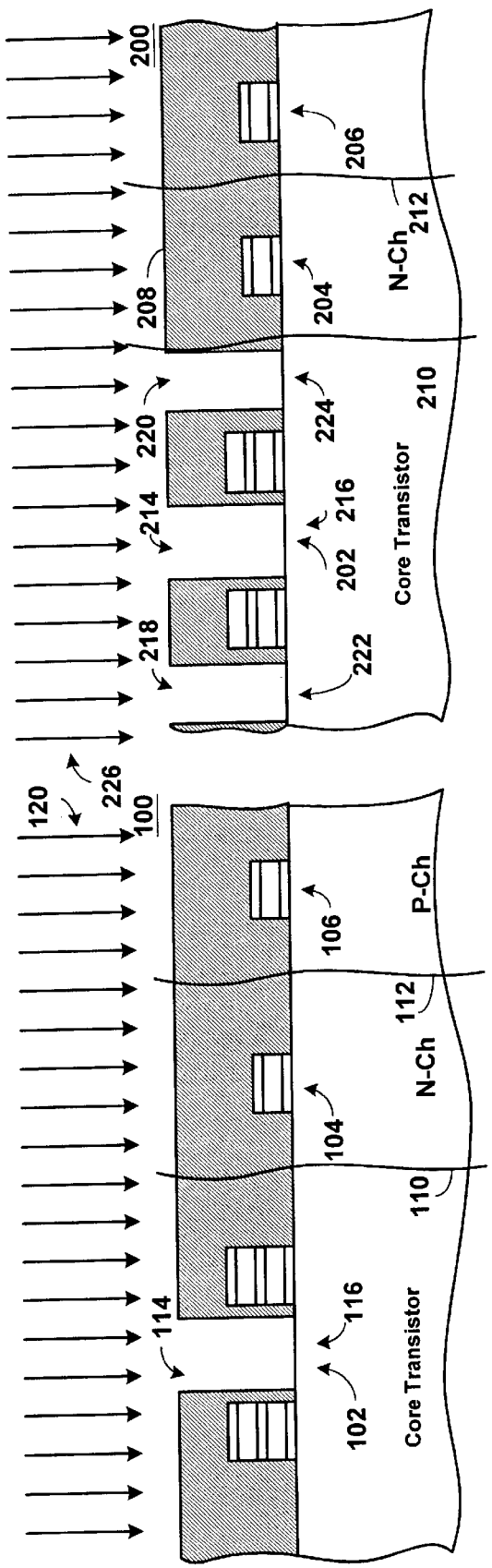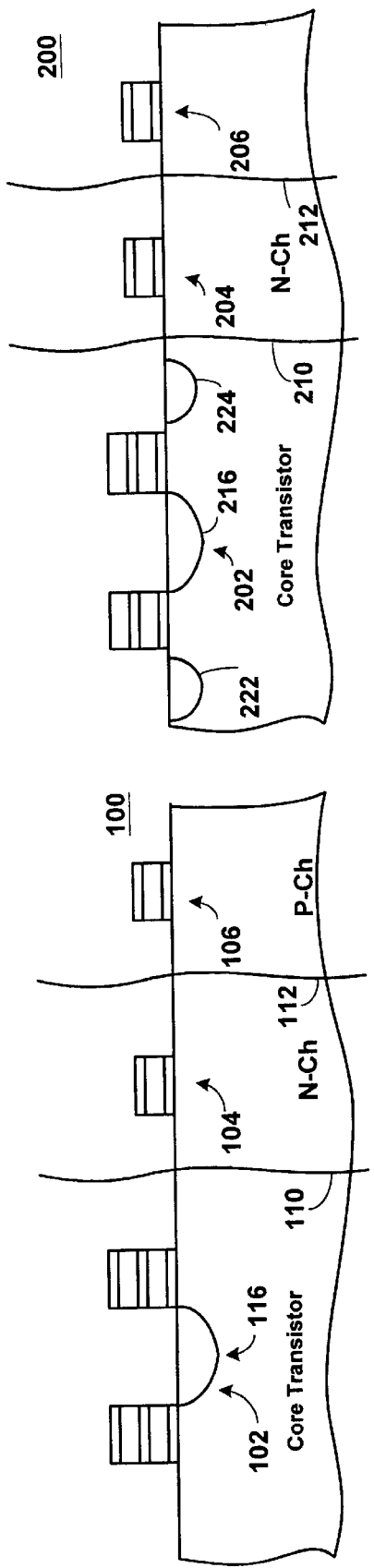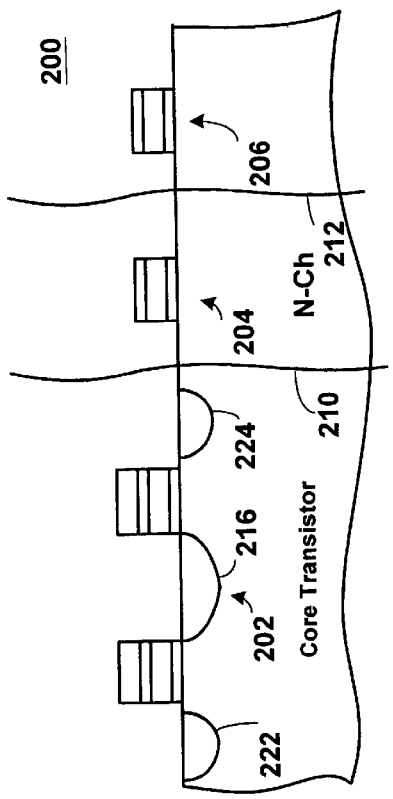

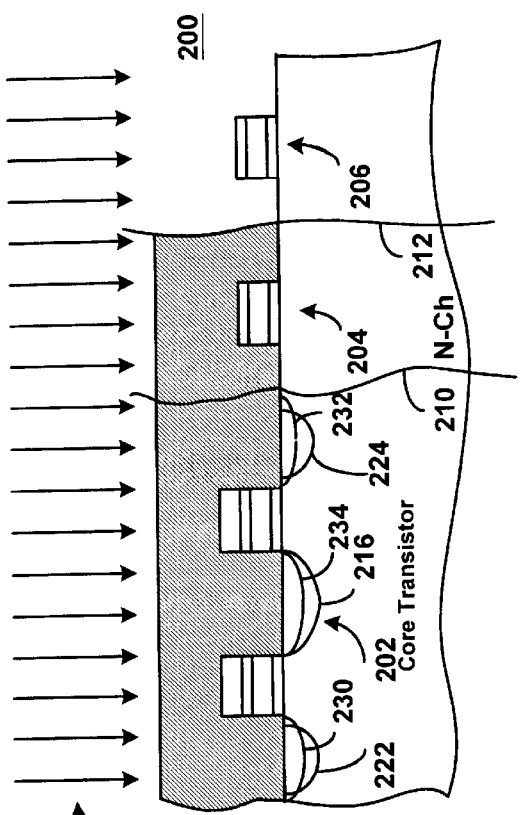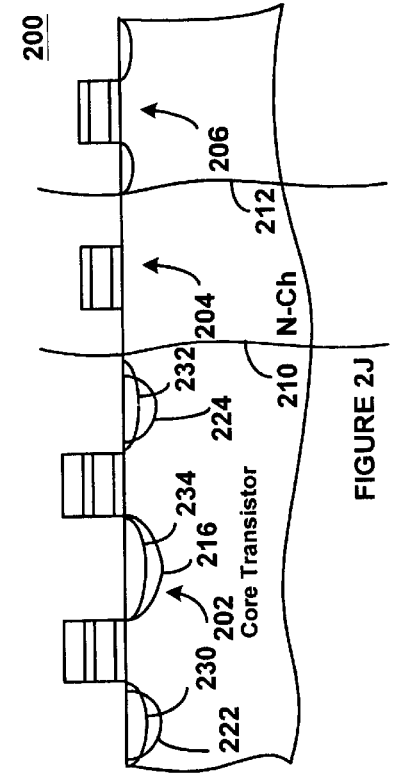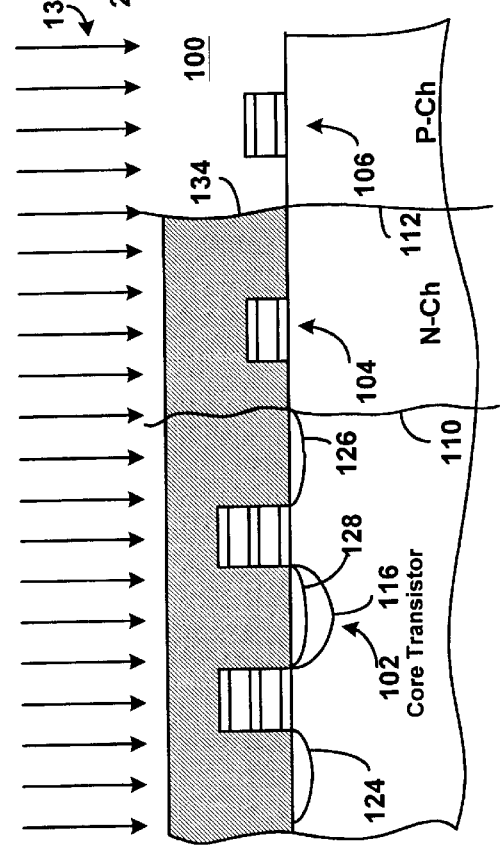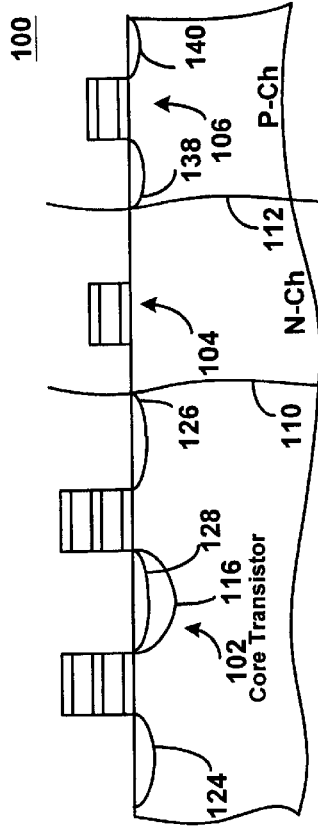
FIGURE 1I (PRIOR ART)
FIGURE 2I
FIGURE 1J (PRIOR ART)
FIGURE 2J

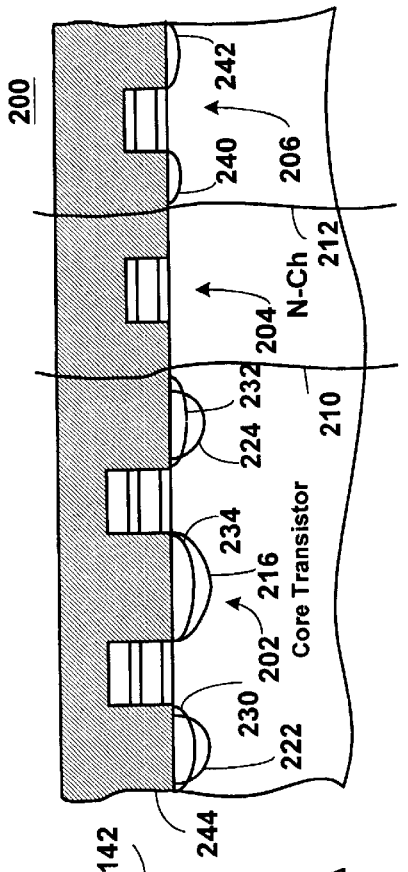
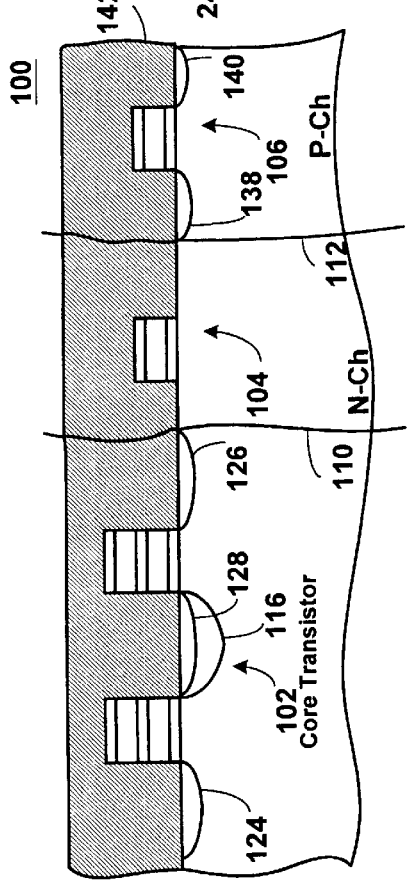
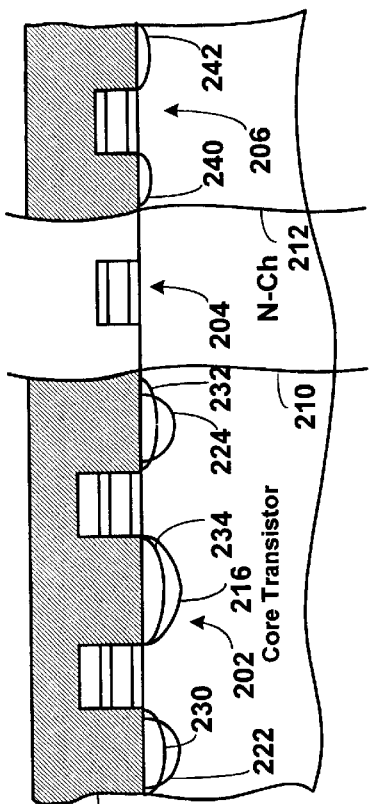
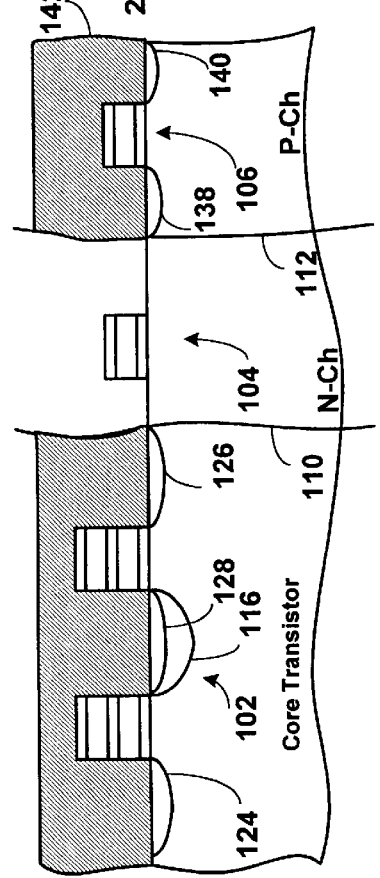

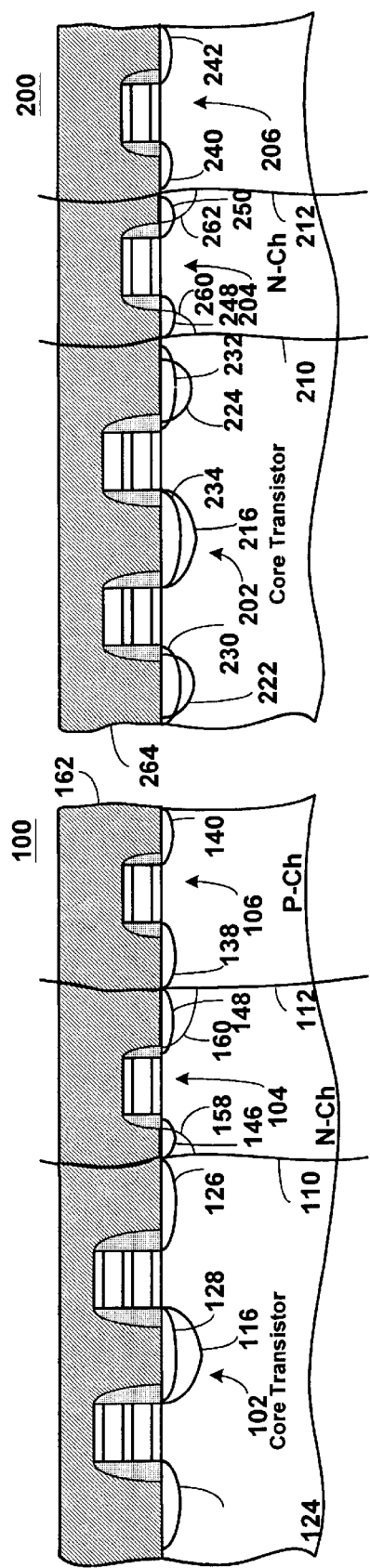
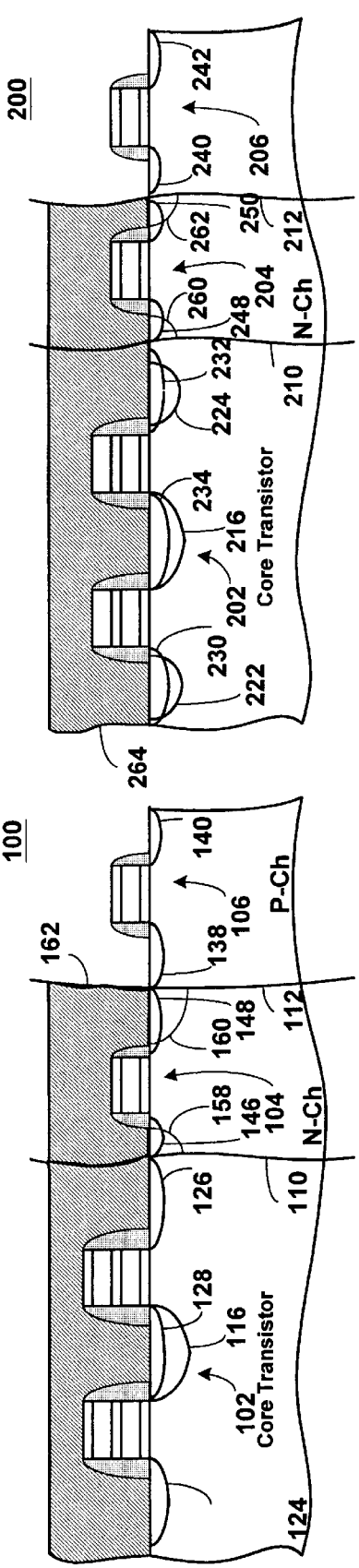
FIGURE 2S
FIGURE 2T
FIGURE 1S (PRIOR ART)
FIGURE 1T (PRIOR ART)

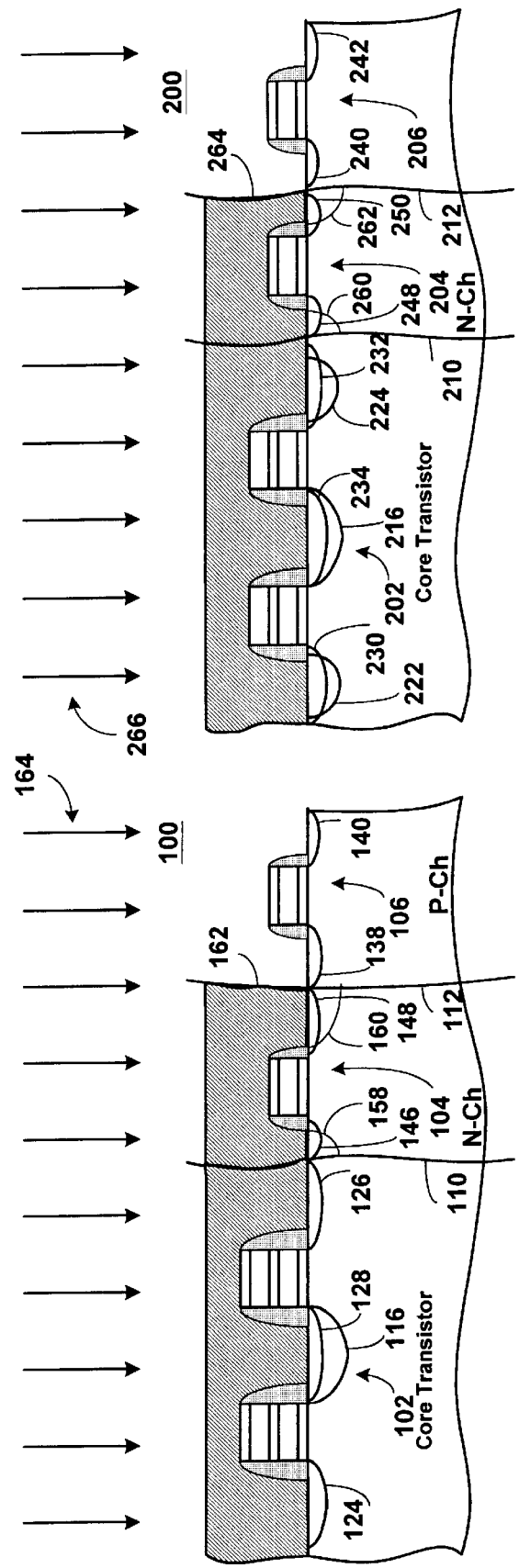
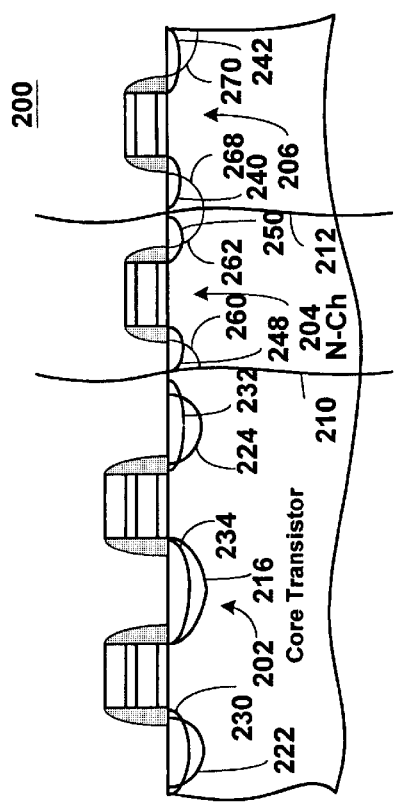
FIGURE 2U
FIGURE 2V
FIGURE 1U (PRIOR ART)
FIGURE 1V (PRIOR ART)

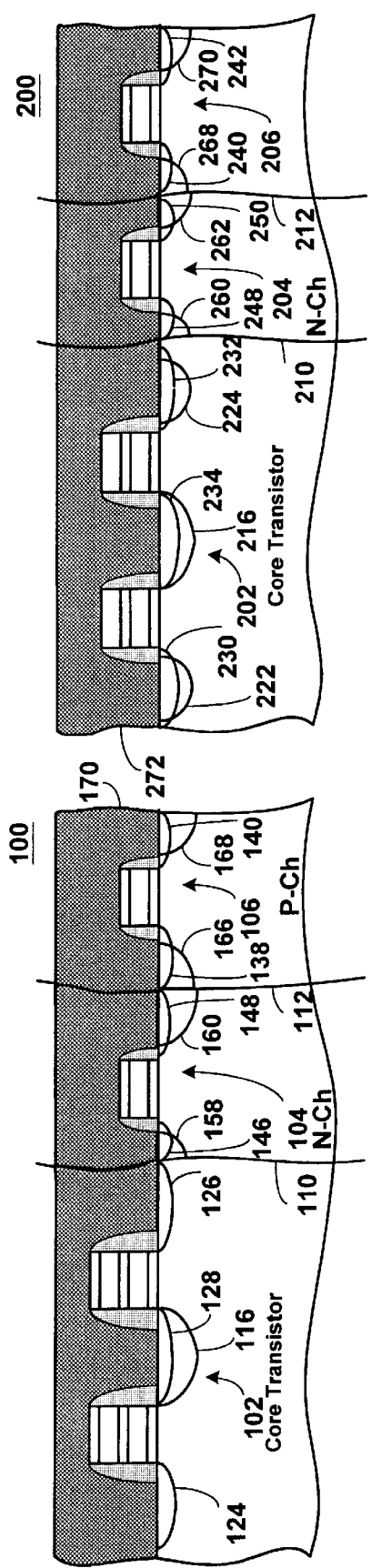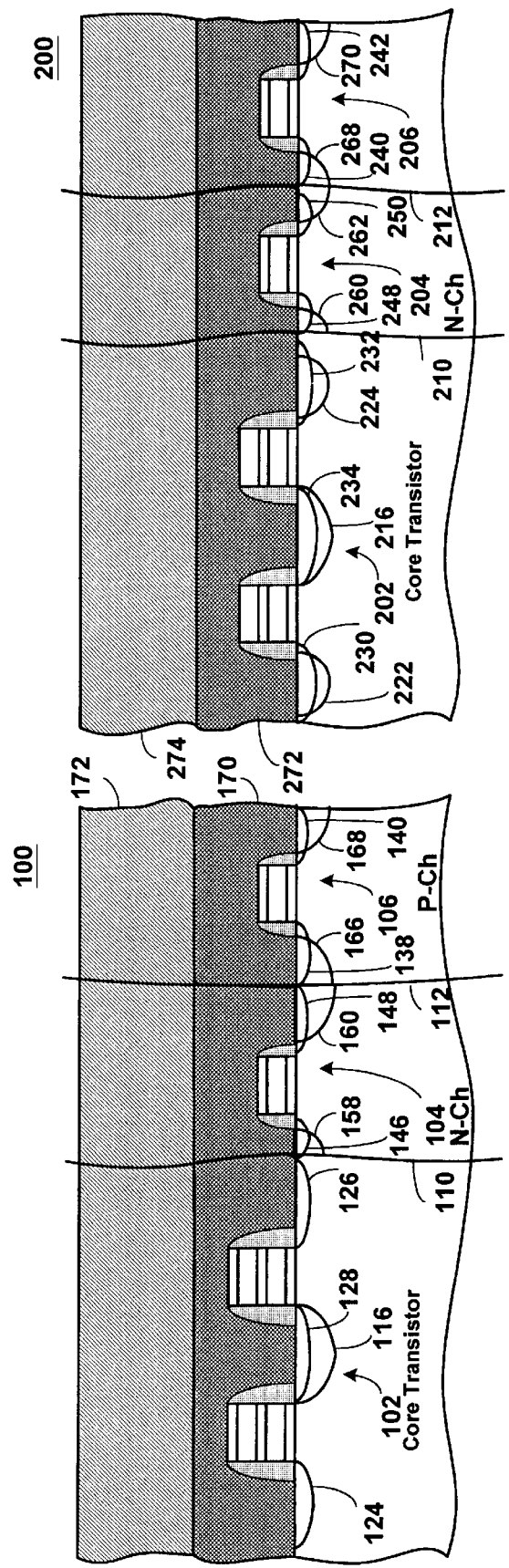

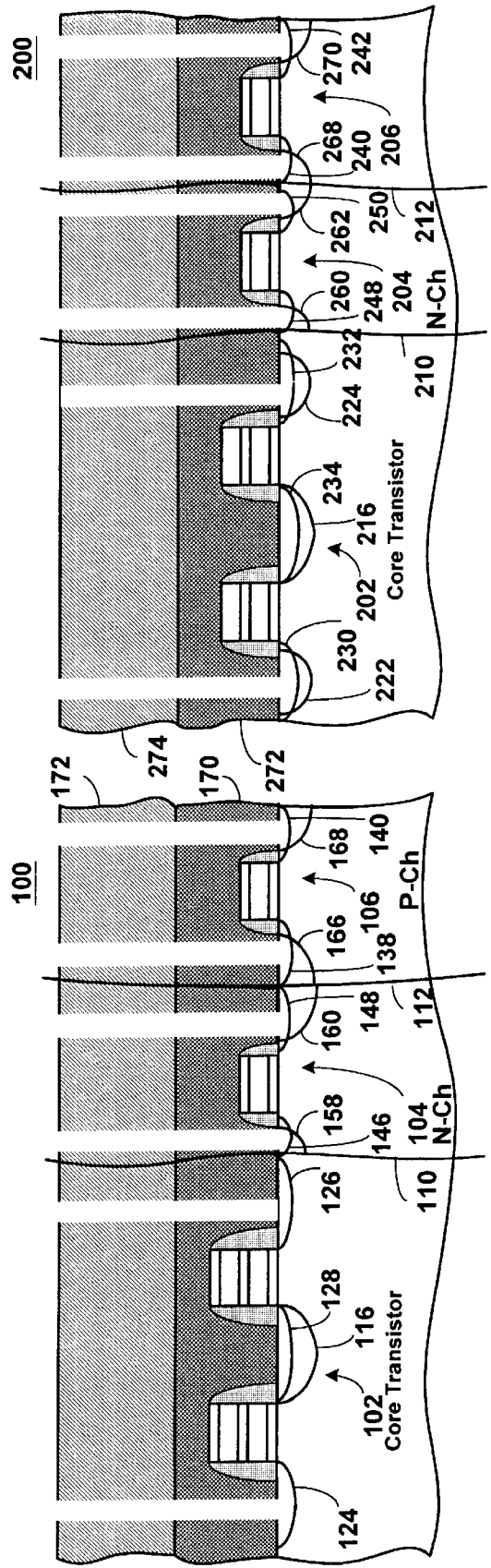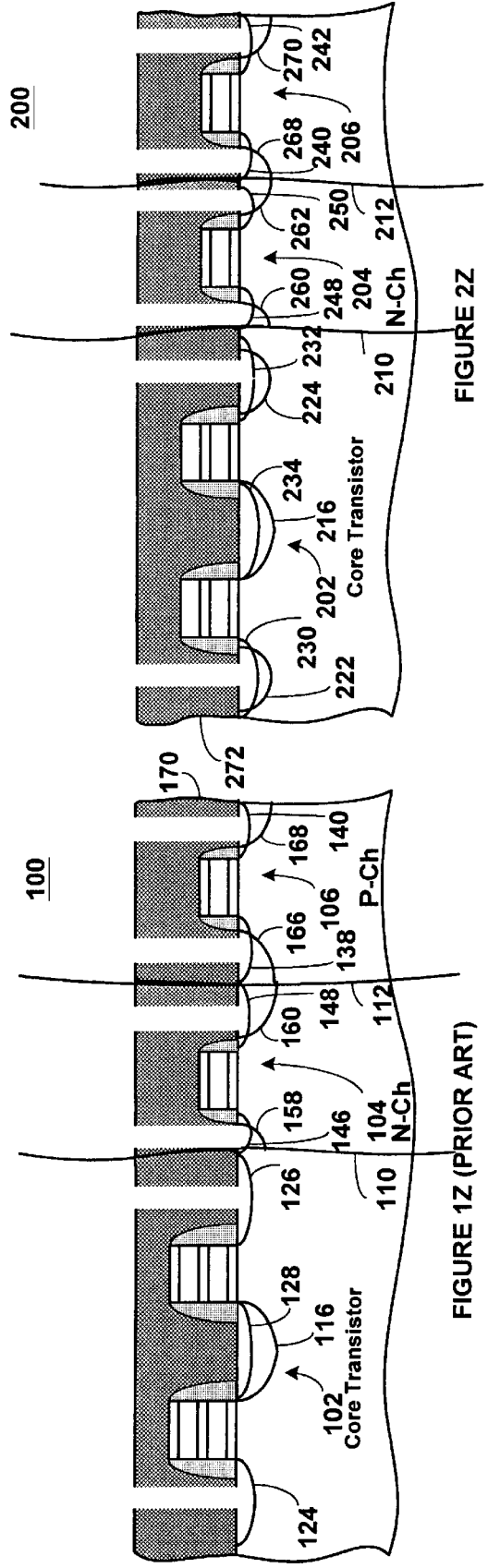

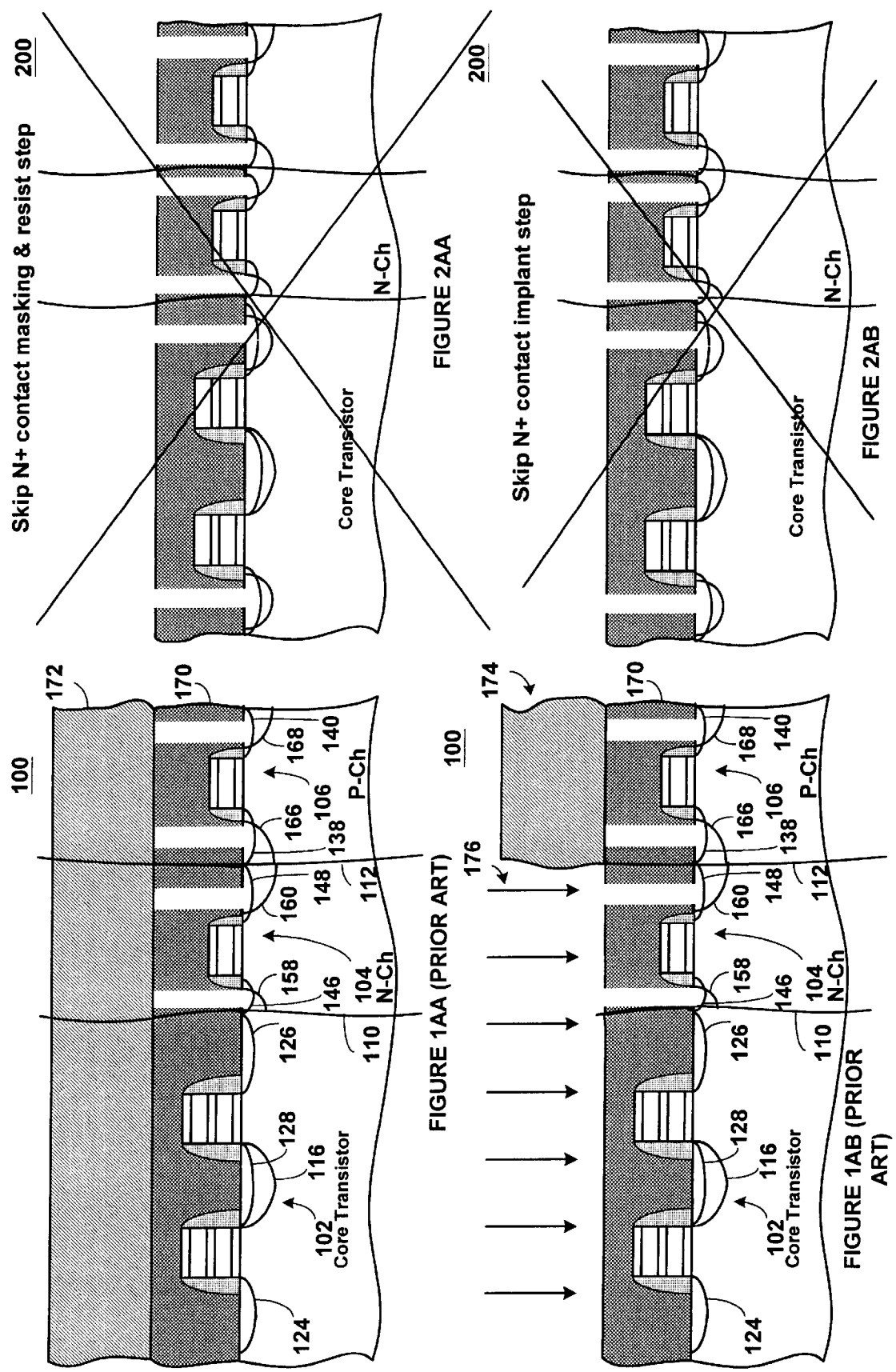

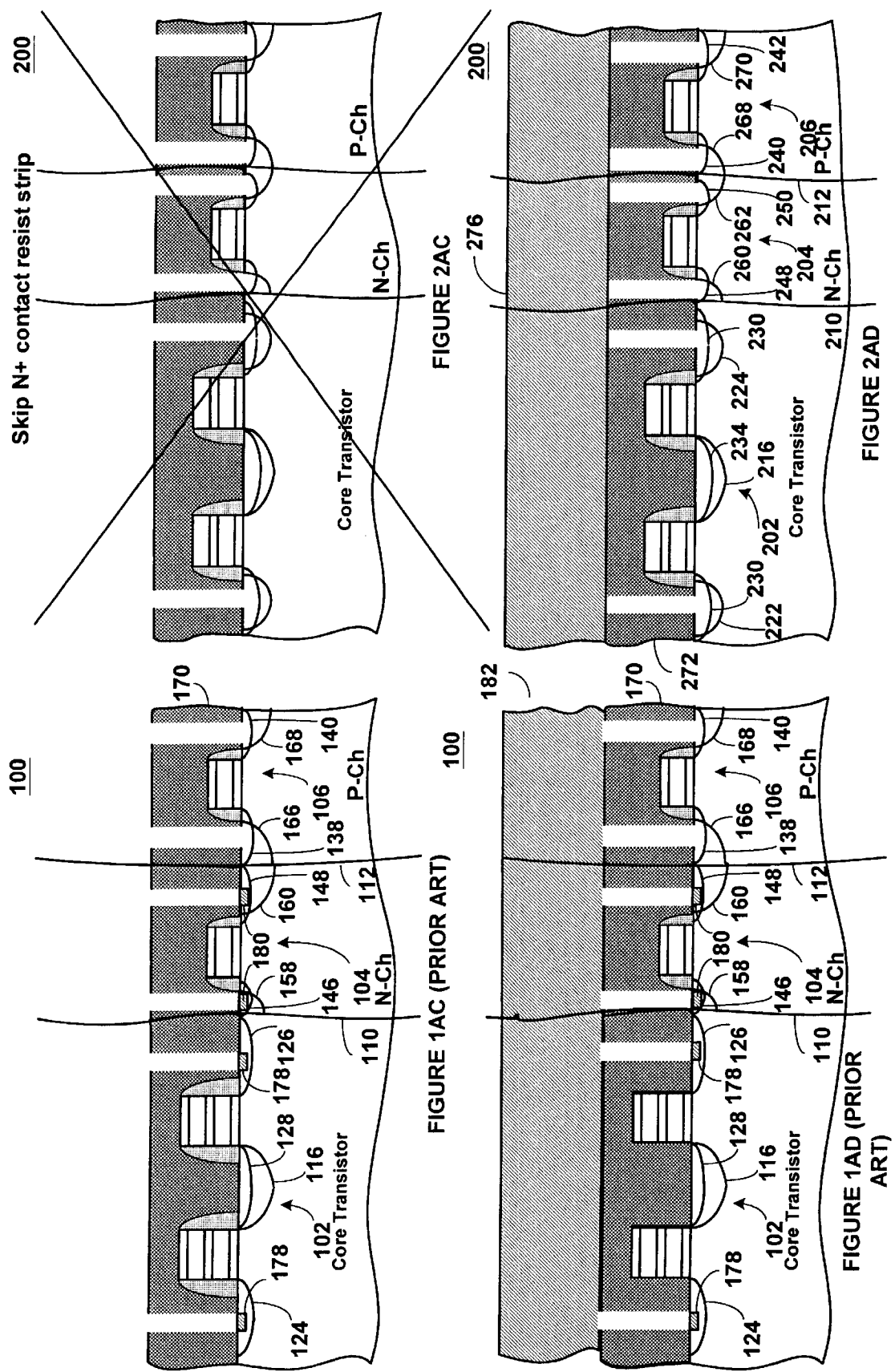

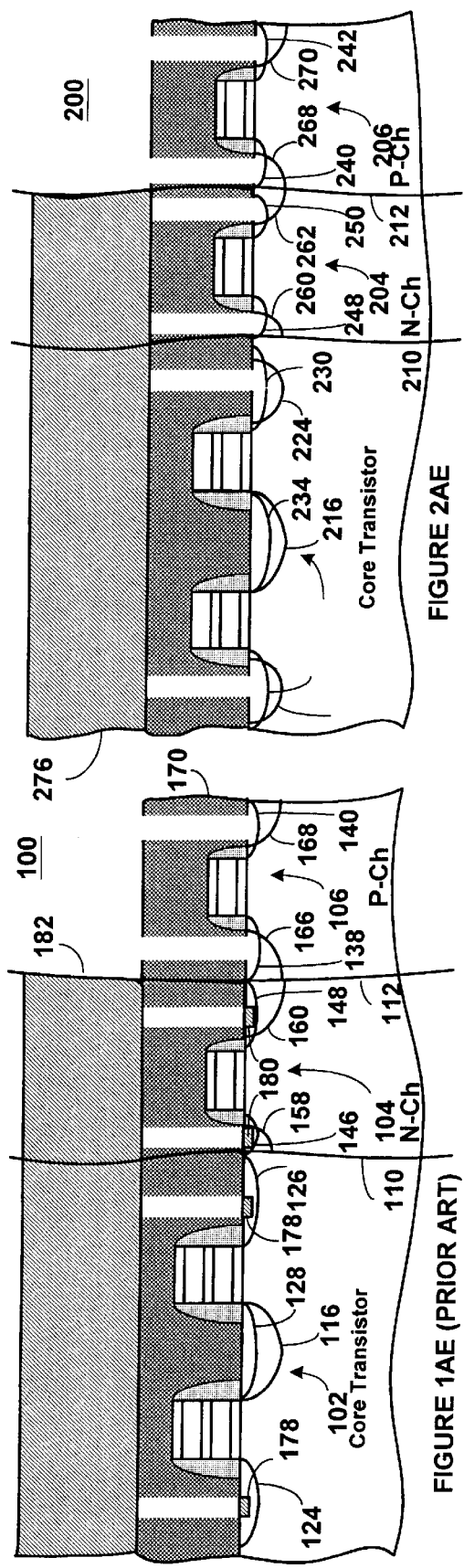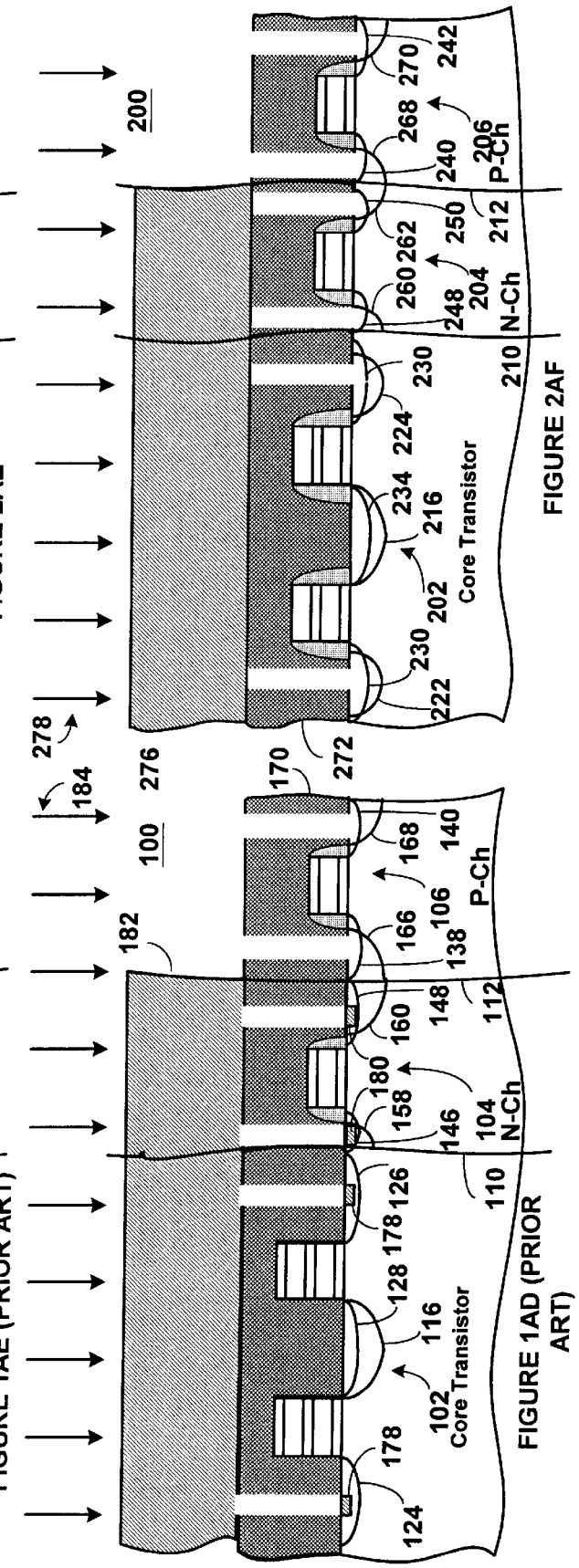

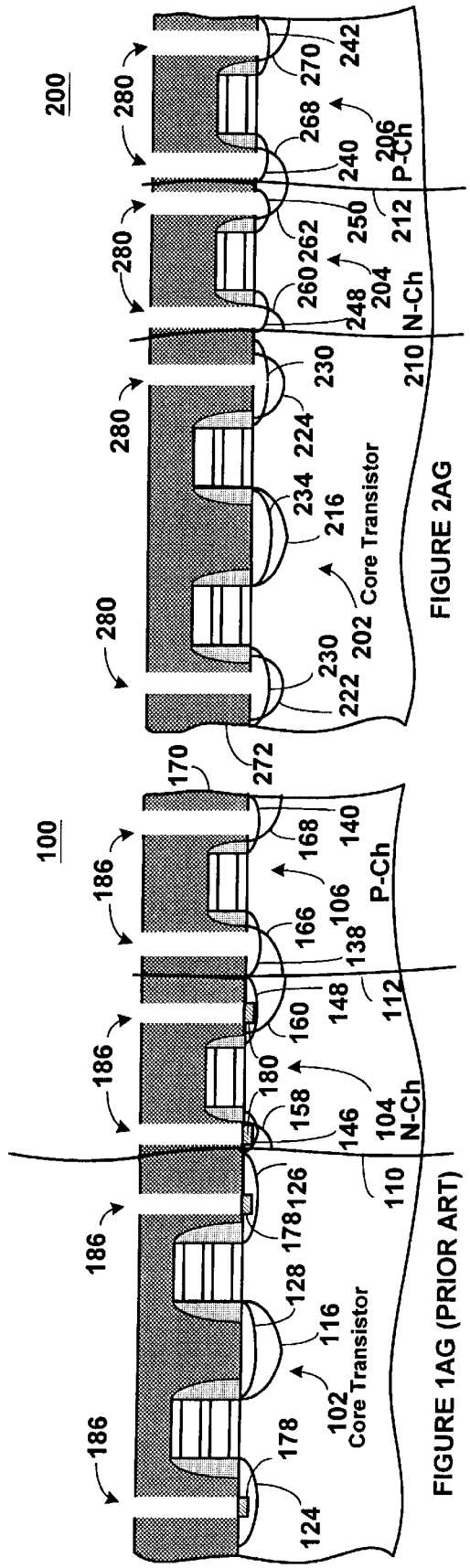

ELIMINATION OF N+ CONTACT IMPLANT FROM FLASH TECHNOLOGIES BY REPLACEMENT WITH STANDARD DOUBLE-DIFFUSED AND N+ IMPLANTS

BACKGROUND OF THE INVENTION

1. Field of the Invention

This invention relates generally to the manufacture of high density, high performance semiconductor devices. More specifically, this invention relates to the manufacture of high density, high performance semiconductor devices utilizing a reduced number of steps during the manufacturing process.

2. Discussion of the Related Art

In order to remain competitive, a semiconductor manufacture must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of devices per unit area on an integrated circuit chip. Another part of reducing the cost of a semiconductor chip is to increase the throughput of the fabrication facility (the "fab").

A single semiconductor chip requires numerous process steps such as oxidation, etching, metallization and wet chemical cleaning. Some of these process steps involve placing the wafer on which the semiconductor chips are being manufactured into different tools during the manufacturing process. As can be appreciated, a reduction in the number of process steps in which the semiconductor wafers must be moved from one tool to another can be a major increase in the throughput of the tab as well as a major decrease in the cost of manufacturing the chips on the semiconductor wafer.

Therefore, what is needed are methods of reducing the number of processing steps necessary to manufacture semiconductor wafers on which semiconductor integrated chips are manufactured.

SUMMARY OF THE INVENTION

According to the present invention, the foregoing and other objects and advantages are obtained by a method of manufacturing a semiconductor memory device that reduces the number of manufacturing steps required to manufacture the device.

In accordance with an aspect of the invention, the method includes the following sequence of steps; core, n-channel and p-channel transistors are formed in a semiconductor substrate, source and drain DDI (double diffused implant) implants are simultaneously formed for the core transistors, source and drain Mdd (modified drain diffusion) implants are formed for the core transistors, source and drain Pldd (P lightly doped drain) implants for the p-channel transistors, source and drain Nldd (N lightly doped drain) implants are formed for the n-channel transistors, sidewall spacers are formed on the core, p-channel and n-channel transistors, N+ implants are formed for the n-channel transistors and P+ implants are formed for the p-channel transistors.

In accordance with another aspect of the invention, P+ contact implants are formed for the p-channel transistors.

The described method thus provides a method for reducing the number of manufacturing steps required to manufacture a semiconductor memory device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

Figure 2E:
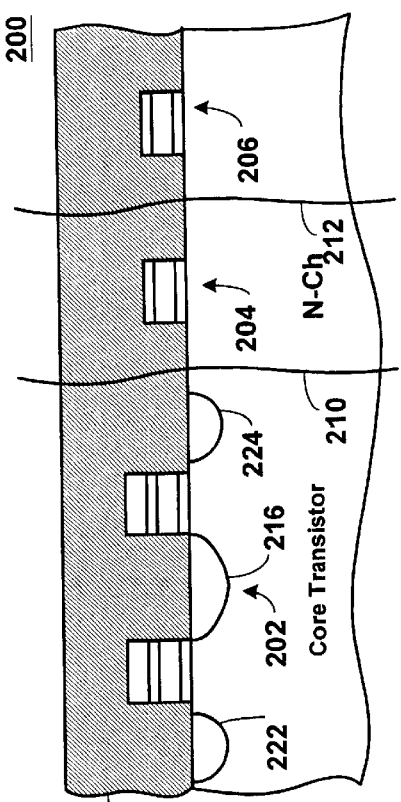

Reference is now made in detail to specific embodiment of the present invention that illustrates the best mode presently contemplated by the inventors for practicing the invention.

FIGS. 1A–1AG show a number of the process steps necessary to manufacture a semiconductor wafer in accordance with the prior art, and FIGS. 2A–2AG show the reduced number of process steps in accordance with the present invention that are necessary to manufacture the semiconductor wafer processed in the process shown in FIGS. 1A–1AG.

The prior art process shown in FIGS. 1A–1AG will be discussed in conjunction with the process shown in FIGS. 2A–2AG in accordance with the present invention in order to clearly point out which process steps have been modified or eliminated.

FIG. 1A shows a portion 100 of a prior art semiconductor wafer including a core transistor 102 region, an n-channel transistor 104 region and a p-channel transistor 106 region with a layer 108 of photoresist formed over the entire semiconductor wafer including the portion 100. The line 110 indicates the separation between the core transistor 102 and the n-channel transistor 104 regions. The line 112 indicates the separation between the n-channel transistor 104 and the p-channel transistor 106 regions.

FIG. 2A shows a portion 200 of a semiconductor wafer manufactured in accordance with the present invention including a core transistor 202 region, an n-channel transistor 204 region and a p-channel transistor 206 region with a layer 208 of photoresist formed over the entire semiconductor wafer including the portion 200. The line 210 indicates the separation between the core transistor 202 and the n-channel transistor 204 regions. The line 212 indicates the separation between the n-channel transistor 204 and. the p-channel transistor 206 regions.

FIG. 1B shows the portion 100 of the prior art semiconductor wafer as shown in FIG. 1A with portions of the layer 108 of photoresist removed from the semiconductor wafer in locations such as 114 in which a core transistor source region 116 is to be formed.

FIG. 2B shows the portion 200 of the semiconductor wafer as shown in FIG. 2A with portions of the layer 208 of photoresist removed from the semiconductor wafer in locations such as 214 in which a core transistor source region 216 is to be formed. In addition, portions of the layer 208 of photoresist are removed from the semiconductor wafer in locations such as 218 and 220 in which contacts to drain regions 222 and 224 are to be formed.

FIG. 1C shows the portion 100 of the prior art semiconductor wafer as shown in FIG. 1B being implanted with a DDI implant indicated by arrows 120.

FIG. 2C shows the portion 200 of the semiconductor wafer as shown in FIG. 2B being implanted with a DDI implant indicated by arrows 226.

FIG. 1D shows the portion 100 of the prior art semiconductor wafer as shown in FIG. 1C with the remaining portions of the layer 108 of photoresist removed from the semiconductor wafer and showing the implanted core transistor source region 116.

FIG. 2D shows the portion 200 of the semiconductor wafer as shown in FIG. 2C with the remaining portions of the layer 208 of photoresist removed from the semiconductor wafer and showing the implanted core transistor source region 216 and the implanted core transistor drain regions 222 and 224.

Figure 1E:
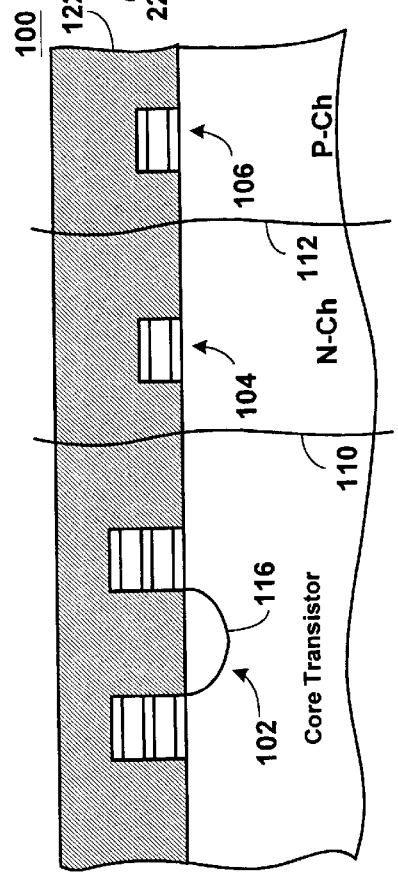
FIGS. 1A–1AG show a number of the process steps necessary to manufacture a semiconductor wafer in accordance with the prior art, and FIGS. 2A–2AG show the reduced number of process steps in accordance with the present invention that are necessary to manufacture the semiconductor wafer processed in the prior art process shown in FIGS. 1A–1AG.

FIG. 1E shows the portion 100 of the prior art semiconductor wafer as shown in FIG. 1D with a second layer 122 of photoresist formed on the surface of the semiconductor wafer.

FIG. 2E shows the portion 200 of the semiconductor wafer as shown in FIG. 2D with a second layer 228 of photoresist formed on the surface of the semiconductor wafer.

Figure 1F:
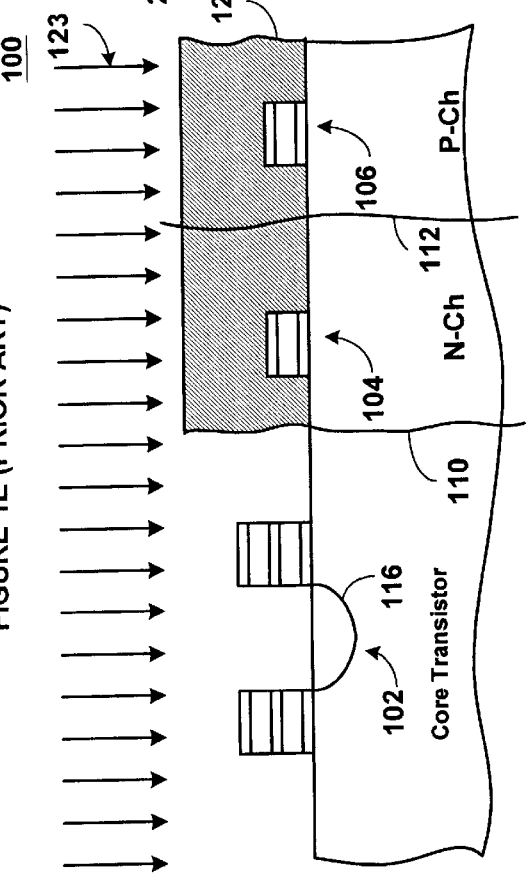

FIG. 1F shows the portion 100 of the prior art semiconductor wafer as shown in FIG. 1E with the second layer 122 of photoresist removed from over the core transistor 102 and the portion 100 of the semiconductor wafer being implanted with an Mdd implant indicated by arrows 123.

Figure 2F:
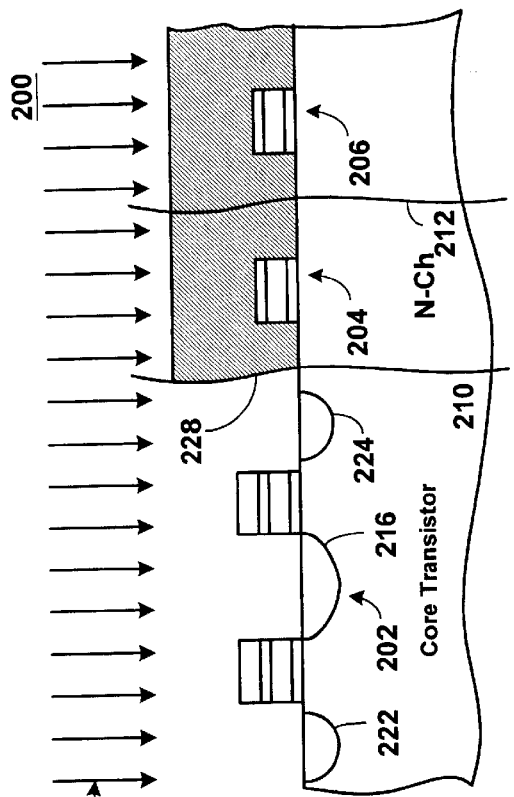

FIG. 2F shows the portion 200 of the semiconductor wafer as shown in FIG. 2E with the second layer 228 of photoresist removed from over the core transistor 202 and the portion 100 of the semiconductor wafer being implanted with an Mdd implant as indicated by arrows 229.

Figures 1G, 1H, 2G, 2H:
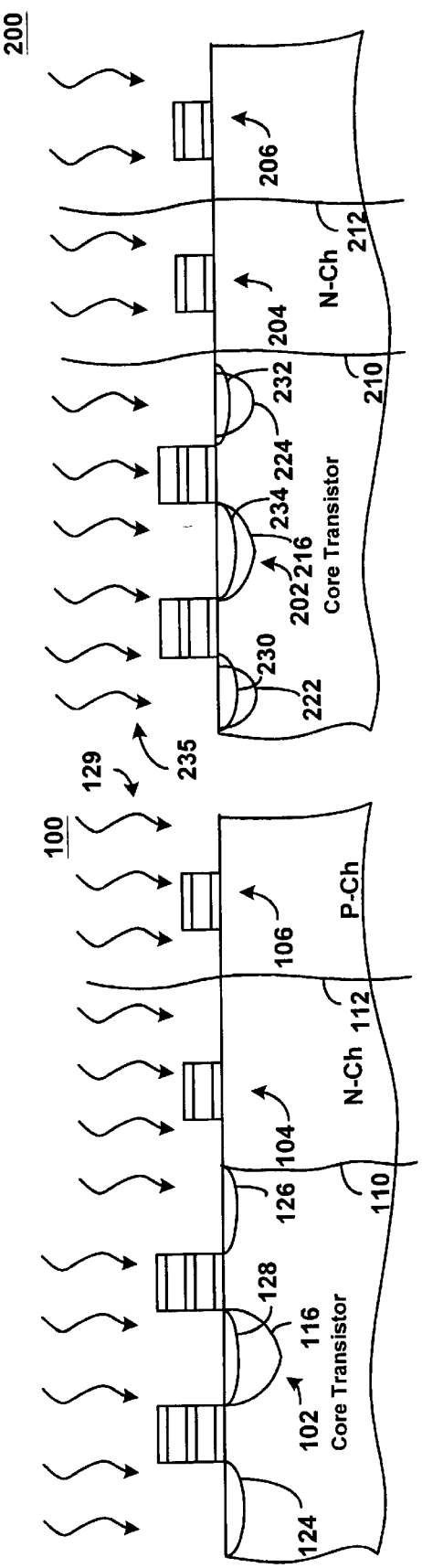

FIG. 1G shows the portion 100 of the semiconductor wafer as shown in FIG. 1F with the remaining portions of the second layer 122 of photoresist removed from the semiconductor wafer and showing the Mdd implant regions 124 and 126 in the core transistor drain regions and the Mdd implant region 128 in the core transistor source region 116. The semiconductor wafer is shown undergoing an oxidation process as indicated by wavy arrows 129.

FIG. 2G shows the portion 200 of the semiconductor wafer as shown in FIG. 2F with the remaining portions of the second layer 228 of photoresist removed from the semiconductor wafer and showing the Mdd implant regions 230 and 232 in the core transistor drain regions 222 and 224, respectively and showing the Mdd implant region 234 in the core transistor source region 216. The semiconductor wafer is undergoing an oxidation process as indicated by wavy arrows 235.

FIG. 1H shows the portion 100 of the semiconductor wafer as shown in FIG. 1G with a third layer 130 of photoresist formed on the surface of the semiconductor wafer.

FIG. 2H shows the portion 200 of the semiconductor wafer as shown in FIG. 2G with a third layer 236 of photoresist formed on the surface of the semiconductor wafer.

FIG. 1I shows the portion 100 of the semiconductor wafer as shown in FIG. 1H with the portion of the third layer 134 removed from the region over the p-channel transistor 106 and with the semiconductor wafer undergoing a Pldd implant as indicated by the arrows 136.

FIG. 2I shows the portion 200 of the semiconductor wafer as shown in FIG. 2H with the portion of the third layer 236 of photoresist removed from the region over the p-channel transistor 206 and with the semiconductor wafer undergoing a Pldd implant as indicated by the arrows 238.

FIG. 1J shows the portion 100 of the semiconductor wafer as shown in FIG. 1I with the remaining portions of the third layer 134 removed and showing the Pldd implants 138 and 140 in the region of the p-channel transistor 106.

FIG. 2J shows the portion 200 of the semiconductor wafer as shown in FIG. 2I with the remaining portions of the third layer 236 removed and showing the Pldd implants 240 and 242 in the p-channel 206 region.

FIG. 1K shows the portion 100 of the semiconductor wafer as shown in FIG. 1J with a layer 142 of photoresist formed on the semiconductor wafer.

FIG. 2K shows the portion 200 of the semiconductor wafer as shown in FIG. 2J with a layer 244 of photoresist formed on the semiconductor wafer.

FIG. 1L shows the portion 100 of the semiconductor as shown in FIG. 1K with a portion of the layer 142 of photoresist removed from the region over the n-channel transistor 104 and with the semiconductor wafer undergoing an Nldd implant as indicated by the arrows 144.

FIGS. 2L shows the portion 200 of the semiconductor wafer as shown in FIG. 2K with a portion of the layer 244 of photoresist removed from the region over the n-channel transistor 204 and with the semiconductor wafer undergoing an Nldd implant as indicated by the arrows 246.

Figure 1M:
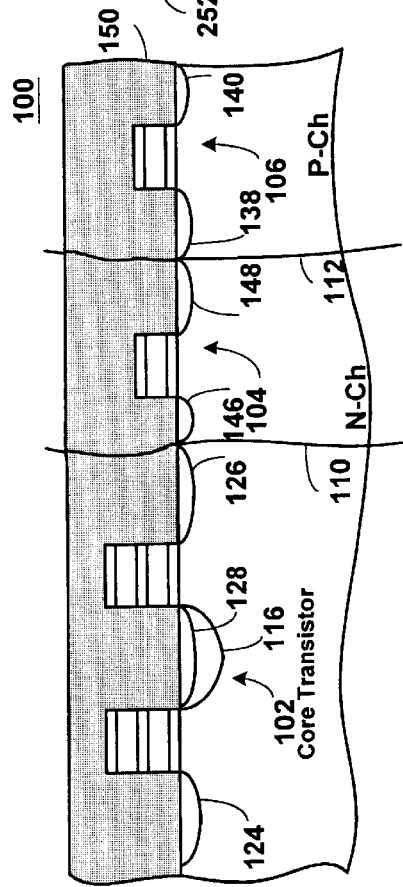

FIG. 1M shows the portion 100 of the semiconductor wafer as shown in FIG. 1L with the remaining portions of the layer 142 of photoresist removed and showing the Nldd implants 146 and 148 in the n-channel transistor 104 region. A layer 150 of spacer oxide is formed on the surface of the semiconductor wafer.

Figure 2M:
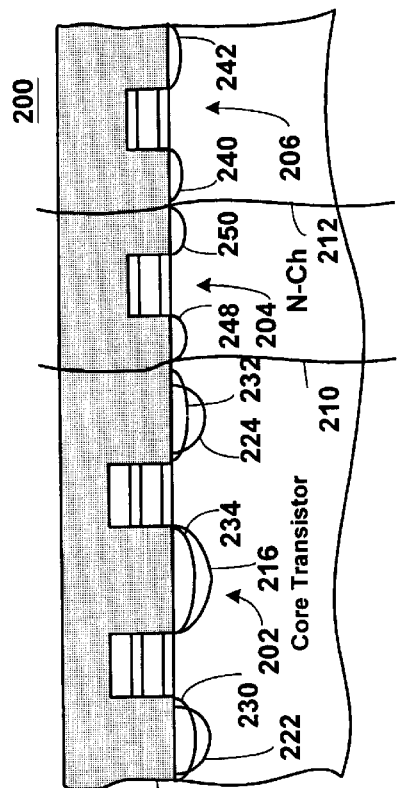

FIG. 2M shows the portion 200 of the semiconductor wafer as shown n FIG. 2L with the remaining portions of the layer 244 of photoresist removed and showing the Nldd implants 248 and 250 in the n-channel transistor 204 region. A layer 252 of spacer oxide is formed on the surface of the semiconductor wafer.

Figure 1N:
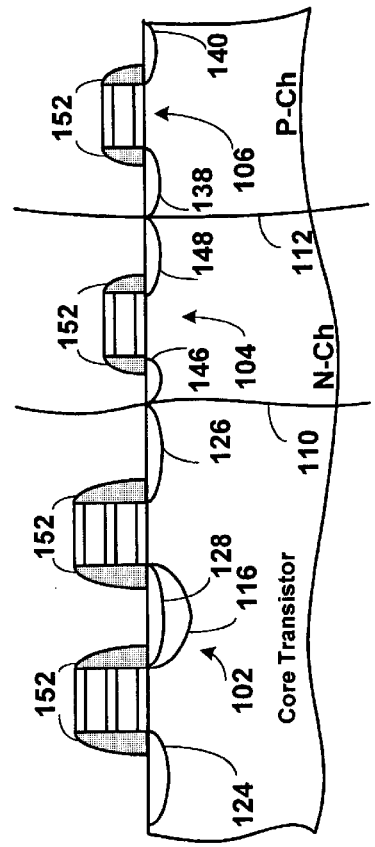

FIG. 1N shows the portion 100 of the semiconductor wafer as shown in FIG. 1M with the layer 150 of spacer oxide etched to form the sidewall spacers 152.

Figure 2N:
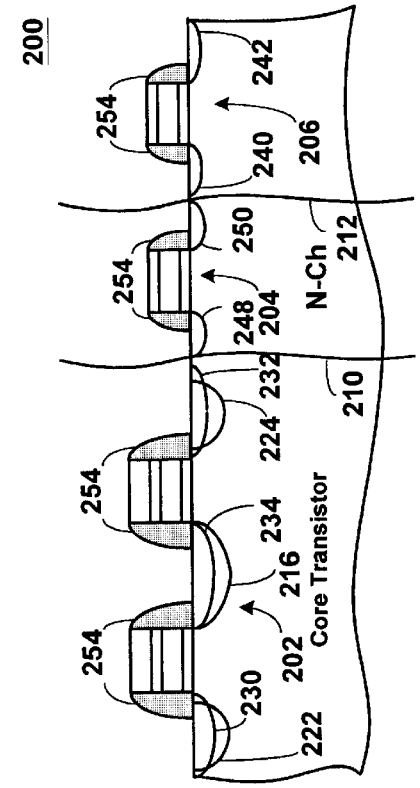

FIG. 2N shows the portion 200 of the semiconductor wafer as shown in FIG. 2M with the layer 252 of spacer oxide etched to form the sidewall spacers 254.

Figure 1O:
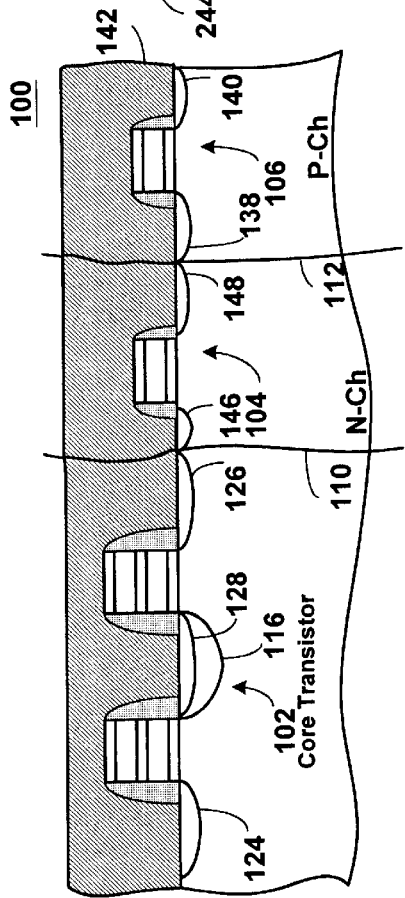

FIG. 1O shows the portion 100 of the semiconductor wafer as shown in FIG. 1N with a fifth layer 154 of photoresist formed on the semiconductor wafer.

Figure 2O:
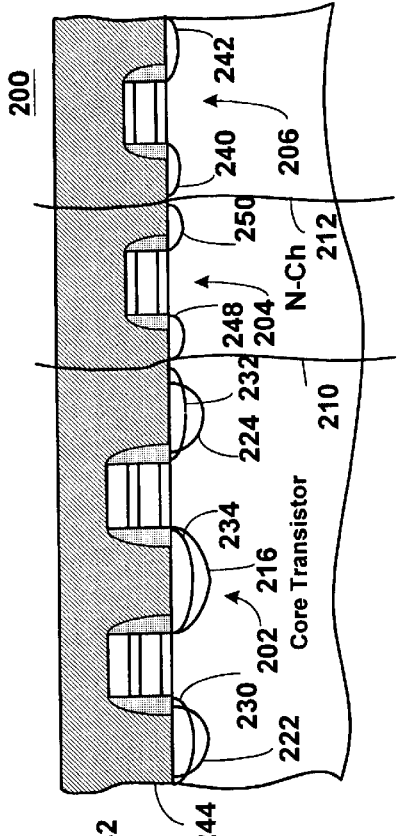

FIG. 2O shows the portion 200 of the semiconductor wafer as shown in FIG. 2N with a fifth layer 256 of photoresist formed on the semiconductor wafer.

Figure 1P:
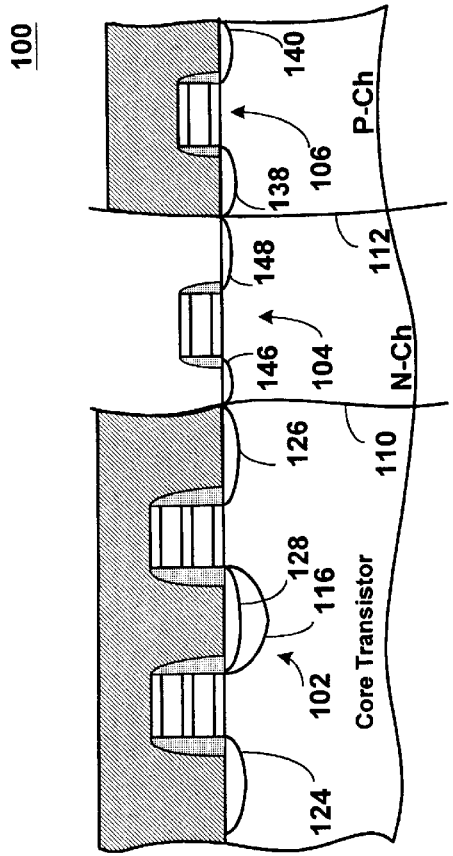

FIG. 1P shows the portion 100 of the semiconductor wafer as shown in FIG. 1O with a portion of the fifth layer 154 of photoresist removed from the region over the n-channel transistor 104.

Figure 2P:
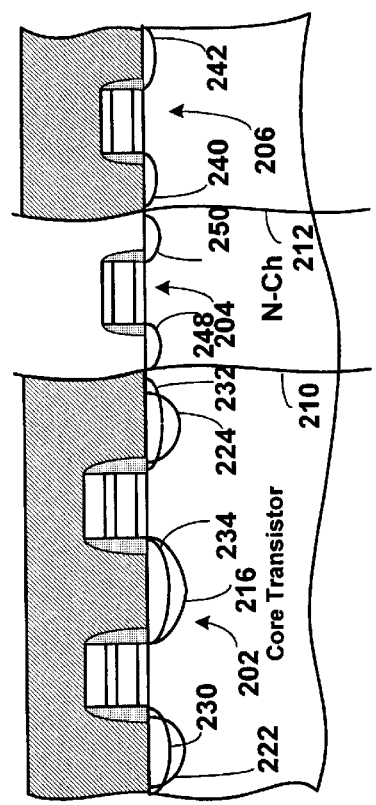

FIG. 2P shows the portion 200 of the semiconductor wafer as shown in FIG. 2O with a portion of the fifth layer 256 of photoresist removed from the region over the n-channel transistor 204.

Figures 1Q, 1R, 2Q, 2R:
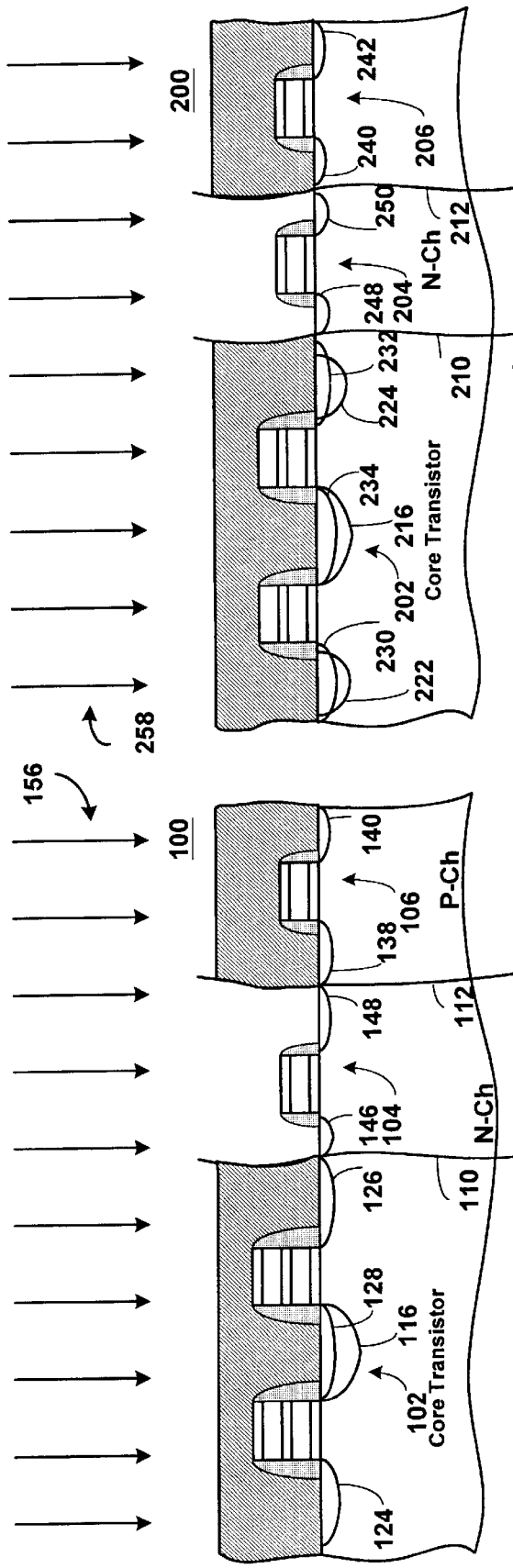

FIG. 1Q shows the portion 100 of the semiconductor wafer as shown in FIG. 1P being implanted with an n+ implant as indicated by arrows 156.

FIG. 2Q shows the portion 200 of the semiconductor wafer as shown in FIG. 2P being implanted with an n+ implant as indicated by arrows 258.

FIG. 1R shows the portion 100 of the semiconductor wafer as shown in FIG. 1Q with the remaining portions of the fifth layer 154 of photoresist removed from the semiconductor wafer and showing the n+ implants 158 and 160 in the n-channel transistor 104 region.

FIG. 2R shows the portion 200 of the semiconductor wafer as shown in FIG. 2Q with the remaining portions of the fifth layer 256 of photoresist removed from the semiconductor wafer and showing the n+ implants 260 and 262 in the n-channel transistor 204 region.

FIG. 1S shows the portion 100 of the semiconductor wafer as shown in FIG. 1R with a layer 162 of photoresist formed on the semiconductor wafer.

FIG. 2S shows the portion 200 of the semiconductor wafer as shown in FIG. 2R with a layer 264 of photoresist formed on the semiconductor wafer.

FIG. 1T shows the portion 100 of the semiconductor wafer as shown in FIG. 1S with a portion of the layer 162 of photoresist removed from the region over the p-channel transistor 106.

FIG. 2T shows the portion 200 of the semiconductor wafer as shown in FIG. 2S with a portion of the layer 264 of photoresist removed from the region over the p-channel transistor 206.

FIG. 1U shows the portion 100 of the semiconductor wafer as shown in FIG. 1T showing the semiconductor wafer undergoing a p+ implant as indicated by the arrows 164.

FIG. 2U shows the portion 200 of the semiconductor wafer as shown in FIG. 2T showing the semiconductor wafer undergoing a p+ implant as indicated by the arrows 266.

FIG. 1V shows the portion 100 of the semiconductor wafer as shown in FIG. 1U with the remaining portions of the layer 162 of photoresist removed and showing the p+ implants 166 and 168 in the p-channel transistor 106 region.

FIG. 2V shows the portion 200 of the semiconductor wafer as shown in FIG. 2U with the remaining portions of the layer 264 of photoresist removed and showing the p+ implants 268 and 270 in the p-channel transistor 206 regions.

FIG. 1W shows the portion 100 of the semiconductor wafer as shown in FIG. 1V with a layer 170 of interlayer oxide formed on the semiconductor wafer.

FIG. 2W shows the portion 200 of the semiconductor wafer as shown in FIG. 2V with a layer 272 of interlayer oxide formed on the semiconductor wafer.

FIG. 1X shows the portion 100 of the semiconductor wafer as shown in FIG. 1W with a layer 172 of photoresist formed on the layer 170 of interlayer oxide.

FIG. 2X shows the portion 200 of the semiconductor wafer as shown in FIG. 2W with a layer 274 of photoresist formed on the layer 272 of interlayer oxide.

FIG. 1Y shows the portion 100 of the semiconductor wafer as shown in FIG. 1X with the layer 172 of photoresist etched to cut holes in the layer 272 of interlayer oxide.

FIG. 2Y shows the portion 200 of the semiconductor wafer as shown in FIG. 2X with the layer 274 of photoresist etched and holes etched in the layer 272 of interlayer oxide exposing drain regions of the core transistors and exposing source and drain regions of the n-channel transistors and the p-channel transistors.

FIG. 1Z shows the portion 100 of the semiconductor wafer as shown in FIG. 1Y with the layer 172 of photoresist removed.

FIG. 2Z shows the portion 200 of the semiconductor wafer as shown in FIG. 2Z with the layer 274 of photoresist removed.

FIG. 1AA shows the portion 100 of the semiconductor wafer as shown in FIG. 1Z with a layer 174 of photoresist formed on the semiconductor wafer.

FIG. 2AA indicates that the step equivalent to the step shown in FIG. 1AA in the prior art can be skipped in the method taught by the present invention.

FIG. 1AB shows the portion 100 of the semiconductor wafer as shown in FIG. 1AA with a portion of the layer 174 removed from the region over the core transistor 102 region and from over the n-channel transistor 104 region and showing the implantation of n+ contact implants indicated by arrows 176. The n+ contact implant is used to reduce the resistance of the n-channel transistor 104 and core transistor 102 contacts.

FIG. 2AB indicates that the step equivalent to the step shown in FIG. 1AB in the prior art can be skipped in the method taught by the present invention.

FIG. 1AC shows the portion 100 of the semiconductor wafer as shown in FIG. 1AB with the remaining portions of the eighth layer 174 removed and showing the n+ contacts 178 in the core transistor 102 and the n+ contacts 189 in the n-channel transistor 104.

FIG. 2AC indicates that the step equivalent to the step shown in FIG. 1AC in the prior art can be skipped in the method taught by the present invention.

FIG. 1AD shows the portion 100 of the semiconductor wafer as shown in FIG. 1AC with a layer 182 of photoresist formed on the semiconductor wafer.

FIG. 2AD shows the portion 200 of the semiconductor wafer as shown in FIG. 2Z with the layer 276 on the semiconductor wafer.

FIG. 1AE shows the portion 100 of the semiconductor wafer as shown in FIG. 1AD with a portion of the layer 276 of photoresist removed from over the p-channel transistor 206.

FIG. 2AE shows the portion 200 of the semiconductor wafer as shown in FIG. 2AD with a portion of the layer 276 of photoresist removed from over the p-channel transistor 206.

FIG. 1AF shows the portion 100 of the semiconductor wafer as shown in FIG. 1AE being implanted with p+ contact implants as indicted by arrows 184.

FIG. 2AF shows the portion 200 of the semiconductor wafer as shown in FIG. 2AE being implanted with p+ contact implants as indicated by arrows 278.

FIG. 1AG shows the portion 100 of the semiconductor wafer as shown n FIG. 1AF showing the p+ contacts 188, with the remaining portions of the layer 182 of photoresist removed and prepared for the forming of metal contacts via holes 186.

FIG. 2AG shows the portion 200 of the semiconductor wafer as shown in FIG. 2AF showing the p+ contacts 182, with the remaining portions of the layer 276 removed and the semiconductor wafer prepared for the forming of metal contacts via holes 280.

In summary, the present invention overcomes the limitations of the prior art and provides a method for the manufacture of semiconductor memory devices that reduces the number of manufacturing steps necessary to manufacture the semiconductor devices resulting in a reduction of the cost of producing the semiconductor memory devices.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device that eliminates the n+ contact implant by using double diffused implants under the core cell contacts, the method comprising:
    (a) forming core transistors, n-channel transistors and p-channel transistors in a semiconductor substrate;
    (b) simultaneously forming source and drain DDI implants for the core transistors;
    (c) forming source and drain Mdd implants for the core transistors;
    (d) forming source and drain Pldd implants for the p-channel transistors;
    (e) forming source and drain Nldd implants for the n-channel transistors;
    (f) forming sidewall spacers on the core, n-channel and p-channel transistors;
    (g) forming N+ implants for the n-channel transistors;
    (h) forming P+ implants for the p-channel transistors; and
    (i) without forming N+ contact implants forming P+ contact implants in the semiconductor substrate in regions in which p-channel transistors will be formed.

2. The method of claim 1 wherein step (b) is accomplished by:
    (j) forming a first layer of photoresist on the semiconductor substrate;
    (k) masking and etching the first layer of photoresist exposing source and drain regions of the core transistors; and
    (l) implanting the exposed source and drain regions with a DDI implant.

3. The method of claim 2 wherein step (c) is accomplished by:
    (m) forming a second layer of photoresist on the semiconductor substrate;
    (n) masking and etching the second layer of photoresist exposing source and drain regions on the semiconductor substrate in which core transistors will be formed; and
    (o) implanting Mdd ions into the exposed source and drain regions on the semiconductor substrate under which core transistors will be formed.

4. The method of claim 3 wherein step (d) is accomplished by:
    (p) forming a third layer of photoresist on the semiconductor substrate;
    (q) masking and etching the third layer of photoresist exposing source and drain regions on the semiconductor substrate in which p-channel transistors will be formed; and
    (r) implanting Pldd ions into the exposed source and drain regions on the semiconductor substrate under which p-channel transistors will be formed.

5. The method of claim 4 wherein step (e) is accomplished by:
    (s) forming a fourth layer of photoresist on the semiconductor substrate;
    (t) masking and etching the fourth layer of photoresist exposing source and drain regions on the semiconductor substrate in which n-channel transistors will be formed; and
    (u) implanting Nldd ions into the exposed source and drain regions on the semiconductor substrate under which n-channel transistors will be formed.

6. The method of claim 5 wherein step (f) is accomplished by:
    (v) forming a layer of sidewall spacer material on the semiconductor substrate; and
    (w) etching the sidewall spacer material to form sidewalls on the gate structures of the core, n-channel and p-channel transistors.

7. The method of claim 6 wherein step (g) is accomplished by:
    (x) forming a fifth layer of photoresist on the semiconductor substrate;
    (y) masking and etching the fifth layer of photoresist exposing source and drain regions on the semiconductor substrate in which n-channel transistors will be formed; and
    (z) implanting N+ ions into the exposed source and drain regions on the semiconductor substrate.

8. The method of claim 7 wherein step (h) is accomplished by:
    (aa) forming a sixth layer of photoresist on the semiconductor substrate;
    (ab) masking and etching the sixth layer of photoresist exposing source and drain regions on the semiconductor substrate in which p-channel transistors will be formed; and
    (ac) implanting P+ ions into the exposed source and drain regions on the semiconductor substrate.

9. The method of claim 8 wherein step (i) is accomplished by:
    (ad) forming a layer of interlayer oxide on the semiconductor substrate;
    (ae) forming a seventh layer of photoresist on the layer of interlayer oxide;
    (af) masking and etching the seventh layer of photoresist exposing the drain regions on the semiconductor substrate in which core transistors will be formed, exposing the source and drain regions on the semiconductor substrate in which n-channel transistors will be formed and exposing the source and drain regions on the semiconductor substrate in which p-channel transistors will be formed;

(ag) removing the seventh layer of photoresist;

(ah) forming an eighth layer of photoresist on the layer of interlayer oxide;

(ai) masking and etching the eighth layer of photoresist exposing source and drain regions on the semiconductor substrate in which p-channel transistors will be formed;

(aj) implanting P+ ions into the exposed source and drain regions of the semiconductor substrate in which p-channel transistors will be formed; and (ak) removing the eighth layer of photoresist.

10. A method of manufacturing a semiconductor device that eliminates the N+ contact implant by using double diffused implants under the core cell contacts, comprising:

forming core transistors, n-channel transistors and p-channel transistors in a semiconductor substrate;

simultaneously forming source and drain DDI implants for the core transistors; and forming source and drain Mdd implants for the core transistors.

11. The method of claim 10, further comprising forming source and drain $N^+$ implants for the n-channel transistors and forming source and drain $P^+$ implants for the p-channel transistors.

12. The method of claim 11, further comprising forming source and drain Pldd implants for the p-channel transistors and forming source and drain Nldd implants for the n-channel transistors.

13. The method of claim 12, further comprising forming sidewall spacers on the core, n-channel and p-channel transistors.

14. The method of claim 13, further comprising forming $N^+$ implants for the n-channel transistors and forming $P^+$ implants for the p-channel transistors.

* * * * *